United States Patent

Moore

(10) Patent No.: US 11,274,964 B2
(45) Date of Patent: Mar. 15, 2022

(54) APPARATUS AND METHOD FOR CONTROLLING THE VOLTAGE APPLIED TO A SPAD

(71) Applicant: STMicroelectronics (Research & Development) Limited, Marlow (GB)

(72) Inventor: John Kevin Moore, Edinburgh (GB)

(73) Assignee: STMicroelectronics (Research & Development) Limited, Marlow (GB)

(*) Notice: Subject to any disclaimer, the term of this patent is extended or adjusted under 35 U.S.C. 154(b) by 108 days.

(21) Appl. No.: 16/681,569

(22) Filed: Nov. 12, 2019

(65) Prior Publication Data

US 2020/0173846 A1 Jun. 4, 2020

(30) Foreign Application Priority Data

Nov. 30, 2018 (EP) .................... 18209521

(51) Int. Cl.
*G01J 1/44* (2006.01)
*H01L 31/107* (2006.01)
*H03K 5/134* (2014.01)
*H03F 3/08* (2006.01)

(52) U.S. Cl.
CPC .............. *G01J 1/44* (2013.01); *H01L 31/107* (2013.01); *H03F 3/08* (2013.01); *H03K 5/134* (2014.07); *G01J 2001/442* (2013.01); *G01J 2001/4466* (2013.01)

(58) Field of Classification Search
CPC .............. H01L 31/107; G01J 2001/442; G01J 2001/4466
See application file for complete search history.

(56) References Cited

U.S. PATENT DOCUMENTS

| 6,028,871 A * | 2/2000 | Vaughan ................. H01S 5/042 372/38.02 |
| 7,087,882 B1 * | 8/2006 | Dries ................. H01L 31/02027 250/214 R |
| 2006/0280511 A1 * | 12/2006 | Futami ............... H04B 10/6911 398/209 |
| 2008/0017785 A1 | 1/2008 | Byren |
| 2011/0292381 A1 * | 12/2011 | Murayama ................. G01J 1/44 356/218 |
| 2013/0009266 A1 | 1/2013 | Sato et al. |
| 2018/0372539 A1 * | 12/2018 | Goden .................... B60R 11/04 |
| 2020/0058821 A1 * | 2/2020 | Baba ........................ G01J 1/42 |

FOREIGN PATENT DOCUMENTS

| CN | 102735351 A | 10/2012 |
| CN | 103650166 A | 3/2014 |
| CN | 211044058 U | 7/2020 |
| JP | 2018179732 A | 11/2018 |

* cited by examiner

*Primary Examiner* — Thanh Luu
(74) *Attorney, Agent, or Firm* — Slater Matsil, LLP

(57) ABSTRACT

In an embodiment of the present invention, a method for controlling a voltage across a single photon avalanche diode includes: providing an output based on a current flowing through the single photon avalanche diode; and controlling the voltage applied across the single photon avalanche diode based on the provided output.

23 Claims, 3 Drawing Sheets

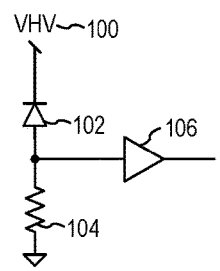
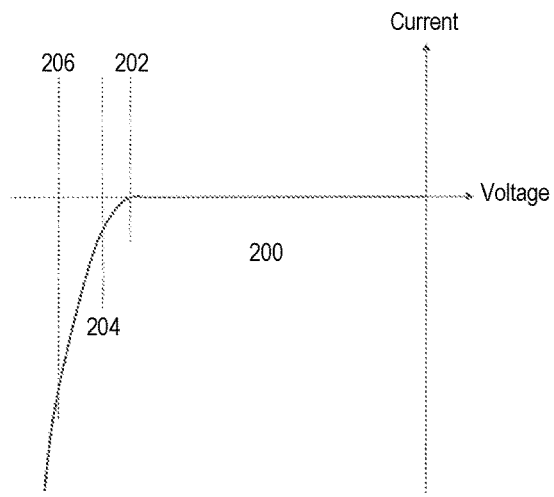
FIG. 1
FIG. 2
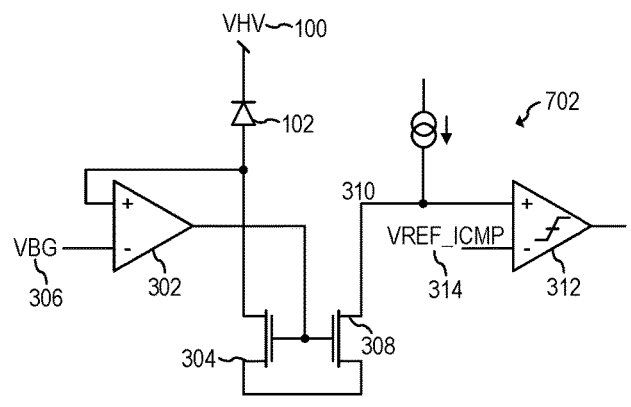
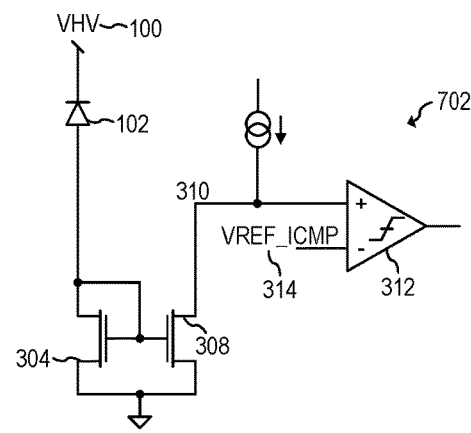
FIG. 3A
FIG. 3B

APPARATUS AND METHOD FOR CONTROLLING THE VOLTAGE APPLIED TO A SPAD

CROSS-REFERENCE TO RELATED APPLICATIONS

This application claims priority to European Patent Application No. 18209521.6, filed on Nov. 30, 2018, which application is hereby incorporated herein by reference.

TECHNICAL FIELD

The present disclosure relates generally to an electronic system and method, and, in particular embodiments, to an apparatus and method for controlling the voltage applied to a single photon avalanche diode (SPAD).

BACKGROUND

Single photon avalanche diodes (SPADs) are semiconductor devices capable of detecting light. A photon impinging on a detection region of a SPAD generates an electron and hole pair via the photoelectric effect. The SPAD is reverse-biased with a high voltage magnitude such that when the electron/hole carriers are generated, the electric field applied across the detection region causes the carriers to be accelerated to a relatively high velocity according to the strength and direction of the applied field. If the kinetic energy of the accelerated carriers is sufficient, additional carriers will be generated from the semiconductor lattice, which are in turn accelerated by the field, and may liberate further carriers in an exponentially increasing fashion. Thus, when a sufficiently high electric field is applied across the detection region, a single impinging photon may generate an avalanche of carriers, resulting in an output current 'pulse', where the current output is proportional to the number of photons detected.

The minimum voltage that causes an avalanche of carriers, and thus allows the device to operate as a SPAD, is known as the breakdown voltage. If the voltage applied across the SPAD is too low, i.e., below the breakdown voltage, then the device does not produce any output. However if the voltage applied across the SPAD is too high, then it is possible that the electric field generated may be sufficient to cause a carrier avalanche even when there are no photons impinging on the SPAD, resulting in a false output current. This false output is known as a "dark current."

SUMMARY

Some embodiments relate to a method and apparatus for controlling the voltage applied to a SPAD.

According to a first aspect, there is provided a method for controlling a voltage across a single photon avalanche diode. The method includes: providing an output dependent on a current flowing through the single photon avalanche diode; and controlling the voltage applied across the single photon avalanche diode in dependence on the provided output.

The provided output may comprise a current.

The method may comprise determining when the provided output satisfies a condition and in response thereto to adjusting a current voltage applied across the single photon avalanche diode by a set voltage value.

The steps of providing the output and controlling the voltage may be repeated until the output satisfies the condition.

The method may comprise comparing the output to a threshold to control the voltage applied to the single photon avalanche diode.

The method may comprise controlling an initial voltage across the single photon avalanche diode such that the initial voltage is one of greater and smaller than a voltage used in normal operation of the single photon avalanche diode; and adjusting the voltage in response to the provided output.

The method may comprise adjusting an initial voltage such that the voltage is closer to a voltage used in normal operation of the single photon avalanche diode.

Controlling the voltage applied across the single photon avalanche diode may comprise controlling at least one of: the cathode voltage applied to the single photon avalanche diode; and the anode voltage applied to the single photon avalanche diode.

According to a second aspect, there is provided an apparatus for controlling a voltage applied across a single photon avalanche diode. The apparatus includes: measurement circuitry configured to provide an output dependent on a current flowing through the single photon avalanche diode; and voltage setting circuitry configured to control the voltage applied across the single photon avalanche diode in dependence on the provided output.

The provided output may comprise a current.

The voltage setting circuitry may be configured to adjust a current voltage applied across the single photon avalanche diode by a set voltage in response to the provided output satisfying a condition.

The voltage setting circuitry may be configured to control the voltage applied across the single photon avalanche diode in response to a comparison of the output to a threshold.

The voltage setting circuitry may be configured to: control a voltage across the single photon avalanche diode such that the voltage is one of greater and smaller than a voltage user in normal operation of the single photon avalanche diode; and adjust the voltage in response to the provided output.

The apparatus may comprise a current comparator configured to compare the provided output to a threshold current.

The voltage setting circuitry may be configured to control at least one of the cathode voltage and the control voltage in dependence on the provided output.

According to a third aspect, there is provided a device comprising an apparatus configured to provide an output dependent on a current flowing through a single photon avalanche diode; and control the voltage applied across the single photon avalanche diode in dependence on the provided output.

BRIEF DESCRIPTION OF THE DRAWINGS

FIG. 1 shows an example of a typical SPAD circuit;

FIG. 2 shows a graph of current flowing through a SPAD as a function of voltage bias applied to the SPAD;

FIGS. 3A and 3B show example circuits of some embodiments for measuring a current from the SPAD and controlling the voltage bias applied to a SPAD;

DETAILED DESCRIPTION OF ILLUSTRATIVE EMBODIMENTS

Figure 4:
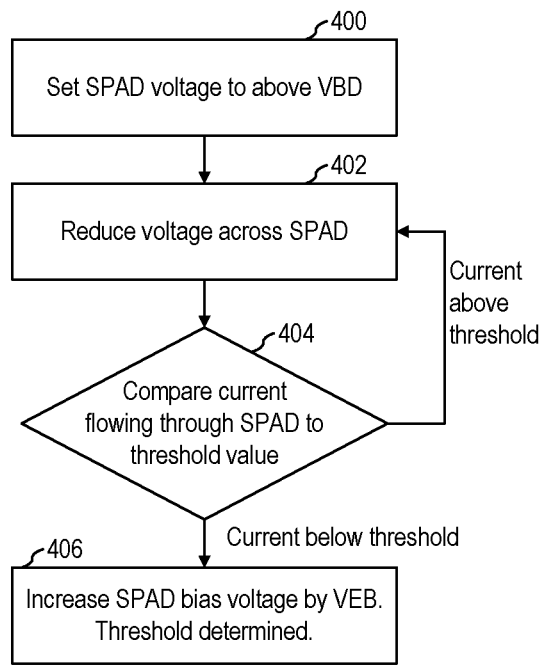
FIGS. 4 and 5 show flow diagrams for the operation of setting the SPAD voltage according to some embodiments.

Some embodiments may provide circuitry for controlling the voltage applied across a SPAD. In order to aid understanding of some of the embodiments described herein, a representation of a typical SPAD circuit is shown in FIG. 1.

In operation, a voltage VHV wo may be applied to the cathode of the SPAD 102. The anode is connected via a resistor 104 to ground, and to an input terminal of a comparator 106. When a photon impinges on the detection region of the SPAD 102, a current is generated in the SPAD, and electrons collected at the anode of the SPAD. The current may be output to the comparator 106. If the current generated is above a threshold value, then an output pulse is produced by the comparator, indicating the detection of a photon. The circuit may also comprise reset circuitry (not shown) for resetting the SPAD ready for the next detection event. After a SPAD detection event, where the anode voltage increases to reduce the current flowing through the SPAD, the anode may be discharged to ground via a resistor. The resistor may be replaced by a metal-oxide semiconductor (MOS) device with a fixed gate bias. With either resistor or MOS with fixed bias, the SPAD is said to operate in active recharge mode.

The SPAD circuit may also comprise a switch to a positive voltage on the anode, allowing the voltage across the SPAD to be reduced, thereby taking the SPAD out of the avalanche region.

In order to better illustrate the operation of a SPAD, reference is now made to FIG. 2.

FIG. 2 shows a representation of the current flowing through the SPAD as a function of the voltage applied across the SPAD. Initially, when there is a zero voltage difference, there is no current flowing, as denoted by the flat line region 200 in FIG. 2.

As the magnitude of the voltage difference between the cathode and the anode increases (i.e., the voltage is made more negative), the voltage difference reaches an initial value 202 where the diode will start to conduct and current will begin to flow. This is known as the breakdown voltage, VBD.

As the voltage applied is made more negative, the voltage reaches a value which represents the minimum voltage that causes an output pulse to be generated when a photon impinges upon the SPAD. This is the voltage difference required to accelerate the photo-generated carriers to sufficiently cause an avalanche within the SPAD. This is the minimum operation voltage 204, $VHV_o$.

The voltage difference may then be made more negative with respect to value 206, which represents an operating voltage of the SPAD which is of a sufficient magnitude so as to generate a current which is easily detectable by the SPAD and trigger an output pulse.

However, if the voltage becomes too negative, i.e., the voltage magnitude becomes too high, then the electric field applied may reach a value at which electron-hole pairs are generated spontaneously (i.e., without the device receiving a photon), resulting in dark current.

In some applications, such as optical communications or light detection and ranging (LIDAR), a device comprises both a light emitter and a SPAD detector. The light emitter may for example be a vertical cavity surface emitting laser (VCSEL). Other embodiments may use other suitable light sources.

In the example of a LIDAR system, light may be emitted by a VCSEL. When the emitted light reaches a target within the field of view of the device, a portion of the light may be reflected back to the SPAD detector. If the voltage applied to the SPAD is too low, then it is not possible to determine whether no light is being received is a result of the SPAD being improperly biased, or if there is no target within the field of view.

Equally, if the voltage difference applied to the SPAD is too high, it is not possible to determine if the current output is a result of a target being present, or if the current output is dark current generated by a high electric field.

Figure 6:
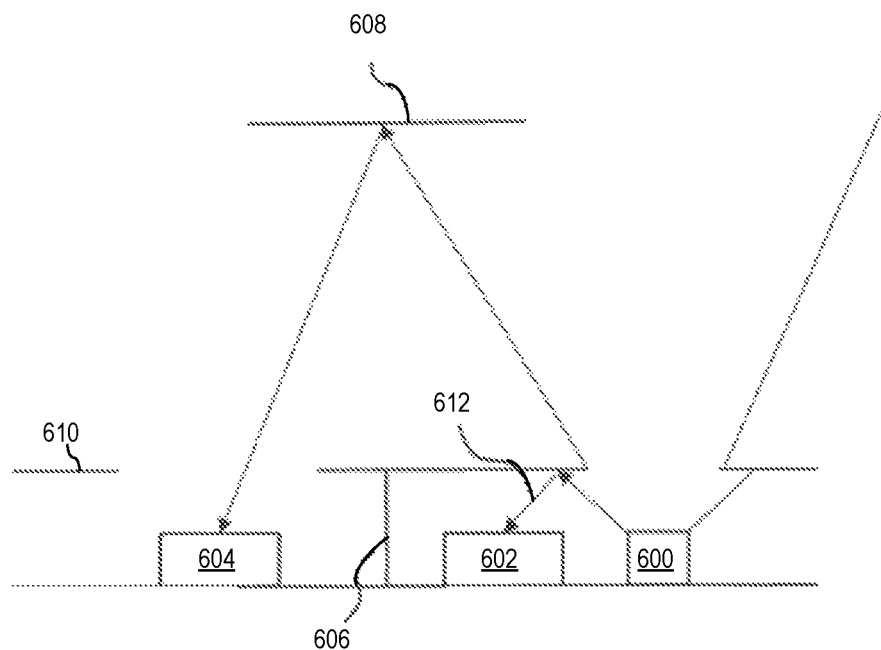
FIG. 6 shows a representation of an example LIDAR system incorporating a reference light path.

It has been proposed, in some devices, to provide a reference light path in the device. An example LIDAR system incorporating a reference light path is shown in FIG. 6. The system comprises a VCSEL 600, a reference SPAD 602 detector and a main SPAD detector 604. The VCSEL 600 may emit light across a wide angle, or field of view of the system, denoted by the dotted lines in FIG. 6. A portion of the light generated by the VCSEL 600 may be blocked by the device housing 610, while the remainder of the light is emitted.

When a portion of the emitted light strikes a target 608, part of the light may be reflected back to the main SPAD detector 604, which receives the reflected light and counts the number of photons received. The number of counts, and timing information may be used to determine and locate objects within the field of view of the device.

A solid partition 606 is located between the VCSEL 600 and the main SPAD detector 604 to ensure no stray light emitted from the VCSEL 600 is detected by the main SPAD detector 604 without it being reflected from the target 608.

The reference light path 612 is formed by a portion of light emitted from the VCSEL 600 being reflected off the interior of the device housing 610, which is detected by the reference SPAD detector 602. Thus the reference light path 612 is engineered to always receive a portion of the light emitted by the VCSEL 600.

With the reference SPAD detector 602, the applied voltage may be gradually changed until a certain count threshold within a set integration period is achieved. This voltage is considered to be the minimum voltage that causes the SPAD to emit an output pulse indicating a photon detection.

The voltage applied to the main SPAD detector 604 may then be set to a value comprising the minimum threshold determined using the reference SPAD detector 602 plus an amount to enter into an assumed robust region of operation of the main SPAD detector 604.

A reference light path is thus built into the device, which uses additional space and may result in an increased cost to manufacture. The time taken to perform the detection and calibration may not be insignificant—for example, it may be of the order of 1 ms, which is time in which data could be gathered.

For some applications, it is desirable to control the voltage applied to a SPAD automatically and/or continuously, without using a reference light path.

Figure 7:
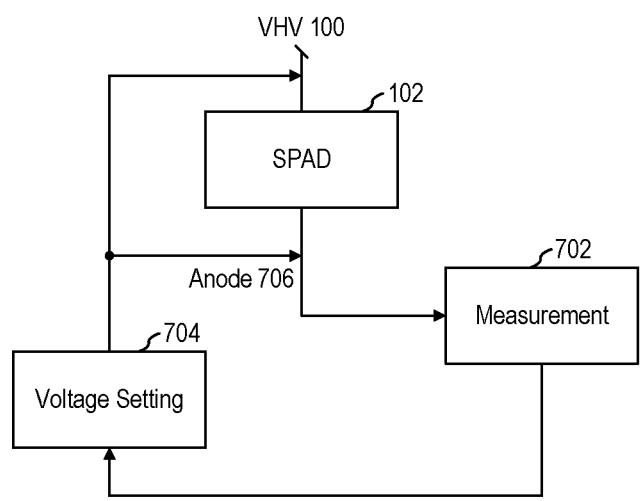
FIG. 7 shows a representation of an apparatus, according to some embodiments.

A representation of an apparatus according to some embodiments is shown in FIG. 7.

In FIG. 7, the apparatus comprises a SPAD 102, a measurement circuit 702, and a voltage setting circuit 704.

The SPAD 102 is supplied with a cathode voltage VHV 100 and an anode voltage 706. The anode of the SPAD 102 outputs a current to the measurement circuit 702. The measurement circuit 702 comprises a circuit suitable for measuring the current output from the SPAD 102.

The measurement circuit 702 is connected to the voltage setting circuit 704. The voltage setting circuit 704 comprises a circuit suitable for receiving an input from the measurement block 702, and controlling at least one of the cathode voltage VHV 100 and the anode voltage 706 applied to the SPAD based on the received input. The voltage setting circuit 704 may be implemented in any way known in the art. For example, in some embodiments, voltage setting 704 may be implemented with a programmable converter, such as programmable LDO, that supplies voltage VHV 100. Other implementations are also possible.

Some example circuits according to some embodiments are shown in FIGS. 3A and 3B. It should be understood that the circuits shown in FIGS. 3A and 3B are non-limiting example implementations of the apparatus described above with reference to FIG. 7. It should be understood that in some embodiments, different circuits to that provided in FIGS. 3A and 3B may be used.

The circuit shown in FIG. 3A comprises a SPAD 102, first n-type FET transistor 304, a second n-type FET transistor 308, and an operational amplifier (op-amp) 302. The SPAD is biased by applying voltage VHV 100 to the SPAD cathode. The anode of the SPAD 102 is connected to the source of the first transistor 304. The anode of the SPAD 102 is also connected to the non-inverting input terminal of op-amp 302. The inverting input terminal of the op-amp receives a biasing voltage VBG 306. The output of the op-amp 302 is connected to the gate of the first transistor 304 and the gate of the second transistor 308. The drains of the first transistor 304 and the second transistor 308 are connected together.

By varying the bias voltage VBG 306, the current passing through the first n-type FET transistor 304 may be varied. Thus the bias voltage VBG 306 determines the anode voltage of the SPAD 102.

The arrangement of the circuit shown in FIG. 3A results in the first transistor 304 and the second transistor 308 forming a current mirror. Thus the current flowing through the SPAD 102, is input into the source of the first transistor 304 and is mirrored by the second transistor 308 and output at 310 to a current comparator 312. The current comparator 312 may compare the current 310 to a threshold value VREF_ICMP 314.

In some embodiments, at least one of the cathode voltage 100 and the bias voltage 306 may be dependent on the output of the current comparator 312.

That is to say, the measurement circuit may comprise a current mirror. The current mirror may be connected to a current comparator. The current mirror may comprise a first transistor 304 and a second transistor 308, wherein a source terminal of the first transistor 304 is connected to an anode 102 of the single photon avalanche diode, and a drain terminal of the first transistor 304 is connected to a drain terminal of the second transistor 308. The drains of the first and second transistors may be held at a ground voltage. The source terminal of the second transistor 308 may be connected to a current comparator 312.

The voltage setting circuit may comprise an op-amp. The op-amp may receive a bias voltage VBG 306 at the inverting input terminal, and the output of the SPAD 102 at the non-inverting input terminal. The output of the op-amp may be connected to the gate of the first transistor 304 and the gate of the second transistor 308. The source of the first transistor may be connected to the anode of the SPAD 102. The bias voltage VBG 306 may be dependent on the output of the current comparator.

In some embodiments, the circuit shown in FIG. 3B may be used. The circuit in FIG. 3B is substantially the same as the circuit shown in FIG. 3A, except that the op-amp 302 has been removed, and the gate of the first transistor 304 and the second transistor 306 may be connected to the output of the SPAD 102.

In some embodiments, alternatively or additionally, the cathode voltage VHV 100 may be dependent on the output of the current comparator.

It should be understood that the use of n-type FETs in the circuits shown in FIGS. 3A and 3B and described above is only one such example. It would be understood by those skilled in the art that any other suitable transistor may be used. For example, a p-type FET may be used. It should be appreciated that alternatively or additionally, different types of transistor may be used such as bipolar transistors or MOSFETs.

With reference to FIGS. 3A and 3B, the circuit of FIG. 3A may provide a more accurate control of the voltage across the SPAD 102. The circuit of FIG. 3B may be smaller, and thus easier and cheaper to manufacture.

It should be appreciated that the examples shown in FIGS. 3A and 3B are only two ways in which some embodiments may be implemented. Other embodiments may be implemented using different circuitry.

Some methods of some embodiments of controlling the voltage applied to a SPAD will now be described with reference to FIGS. 4 and 5.

According to some embodiments, the voltage VHV applied to the SPAD is fixed at a first value such that the voltage is well above the breakdown voltage VBD. The operation of setting the SPAD voltage to above VBD is shown in FIG. 4 by step 400.

The voltage applied across the SPAD may then be reduced. The operation of reducing the voltage applied across the SPAD is shown in FIG. 4 by step 402.

The current flowing through the SPAD may then be compared to a threshold value. The operation of comparing the current flowing through the SPAD to a threshold value is shown in FIG. 4 by step 404.

If the current flowing through the SPAD is above the threshold value, the method repeats step 402, where the voltage applied across the SPAD may be reduced, and the current flowing through the SPAD again determined and compared to the threshold value in step 404.

When the comparison in step 404 results in the current flowing through the SPAD being below the threshold value, the voltage applied across the SPAD may be increased by a fixed amount VEB. The subsequently applied voltage is determined to be the operating threshold voltage of the SPAD.

The applied excess bias voltage VEB may be large enough to ensure that a current output from the SPAD exceeds a threshold current of the SPAD readout circuitry for all SPAD pixels. Increasing the excess bias voltage above this value may result in increasing the sensitivity of the SPAD—that is to say, an incident photon may be likely to trigger an avalanche in the SPAD when a large excess bias is applied. Increasing the excess bias may, however, also result in increased dark count rate (the dark count rate being outputs from the SPAD pixel which occur without the presence of a photon due to defects within the silicon).

In some embodiments the applied excess bias voltage VEB may be determined by a trade-off between the achieved sensitivity and dark count rate. Additionally or alternatively, a further factor which may be considered is based on the ability to turn off the SPADs when they are not in operation.

In some embodiments it may be possible to have some SPADs within an array enabled while others are disabled. For a SPAD configured with a high voltage VHV on the cathode and zero volts on the anode during normal operation, the SPAD may be disabled by pulling the anode voltage to a higher voltage. The anode voltage may be set by the supply voltage. The anode voltage being increased may cause the voltage across the SPAD to be lower than the breakdown voltage VBD, moving the SPAD out of its avalanche region. In some embodiments, the applied excess bias voltage may be smaller than the voltage used to disable the SPAD to enable the SPAD to be disabled.

In some embodiments, the increase in the voltage may be dependent on one or more other factors. The one or more other factors may be any other suitable factors such as temperature, operating conditions, application and/or the like. Employing an increased voltage may result in increased probability of detecting a photon at the expense of increased Dark Count Rate.

The operation of increasing the voltage applied across the SPAD by VEB is shown in FIG. 4 by step 406.

According to another embodiment, the voltage VHV applied to the SPAD is fixed at a second value well below the breakdown voltage VBD. The operation of setting the voltage applied across the SPAD to above VBD is shown in FIG. 5 by step 500.

The voltage applied across the SPAD may then be increased. The operation of increasing the voltage applied across the SPAD is shown in FIG. 5 by step 502.

The current flowing through the SPAD may then be compared to a threshold value. The operation of comparing the current flowing through the SPAD to a threshold value is shown in FIG. 5 by step 504.

If the current flowing through the SPAD is below the threshold value, the method repeats step 502, where the voltage applied across the SPAD may be increased, and the current flowing through the SPAD again compared to the threshold value in step 504.

When the comparison in step 504 results in the current flowing through the SPAD being above the threshold value, the voltage applied across the SPAD may be increased by a fixed amount VEB. The subsequently applied voltage is determined to be the operating threshold voltage of the SPAD.

Figure 5:
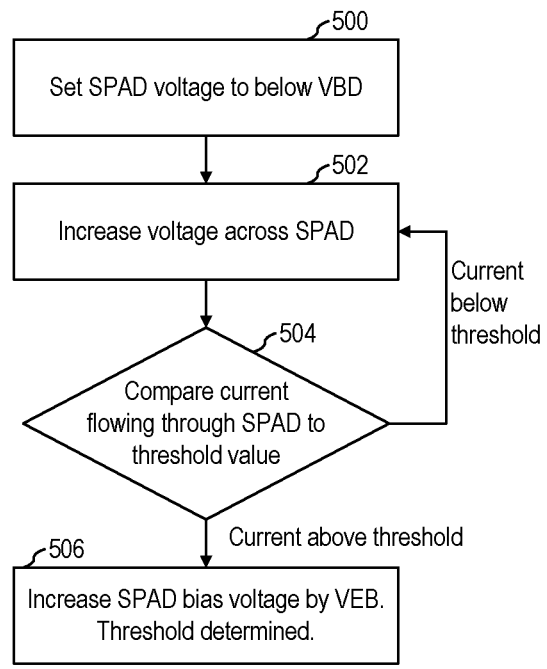

The operation of increasing the voltage applied across the SPAD by VEB is shown in FIG. 5 by step 506.

In some embodiments, the increase in the voltage may be dependent on the current voltage being used.

In some embodiments, the increase in the voltage may be dependent on one or more other factors. The one or more other factors may be any other suitable factors such as temperature, operating conditions, application and/or the like.

In one modification, some embodiments may carry out steps 400 to 404 of FIG. 4 and steps 500 to 504 of FIG. 5. The voltage which triggers the current to be below the threshold in FIG. 4 and the voltage which triggers the current to be above the threshold in FIG. 5 are both used to determine an operating bias voltage for the SPAD.

Some embodiments may provide a method comprising determining a current flowing through a single photon avalanche diode, and controlling the voltage applied to the single photon avalanche diode in dependence on the determined current.

In some embodiments, determining the current flowing through the SPAD may comprise setting the voltage applied to the SPAD with respect to a threshold voltage, adjusting the voltage applied to the SPAD, and comparing the current flowing through the SPAD to a threshold current.

In some embodiments, setting the voltage applied to the SPAD with respect to a threshold voltage comprises setting the voltage applied to the SPAD above the threshold value.

In some embodiments, setting the voltage applied to the SPAD with respect to a threshold voltage comprises setting the voltage applied to the SPAD below the threshold value.

In some embodiments, adjusting the voltage applied to the SPAD comprises reducing the voltage applied to the SPAD. In some embodiments, adjusting the voltage applied to the SPAD comprises increasing the voltage applied to the SPAD.

In some embodiments, the comparison is successful if the current flowing through the single photon avalanche diode is below a threshold current. In some embodiments, the comparison is successful if the current flowing through the single photon avalanche diode is above a threshold current.

In some embodiments, controlling the voltage applied to the SPAD in dependence on the determined current may comprise increasing the voltage applied to the SPAD by a set value in response to the comparison being successful.

In some embodiments there may be a single SPAD. In other embodiments, there may be an array of SPADs. Where there is more than one SPAD, each SPAD may have its voltage individually controlled such as described previously. In some embodiments, where there is more than one SPAD, one or more SPADs may act as reference SPADs for the determining of a voltage. The determined voltage for these one or more SPADs may be used to control the voltage applied to one or more other SPADs. It should be appreciated that these so-called reference SPADs may be configured to be a detecting SPAD.

The apparatus and method described above may be implemented in any device or apparatus which utilizes single photon avalanche detectors. For example, the apparatus and method described above may be implemented in automotive LIDAR, medical systems (fluorescence lifetime imaging microscopy for example), industrial ranging, light sensing and in communications. It should be understood that these non-limiting implementations are only exemplary, and the apparatus and method may be implemented in any manner of other light-detecting applications.

It should be appreciated that the above described arrangements may be implemented at least partially by an integrated circuit, a chip set, one or more dies packaged together or in different packages, discrete circuitry or any combination of these options.

Various embodiments with different variations have been described here above. It should be noted that those skilled in the art may combine various elements of these various embodiments and variations.

Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. A method for controlling a voltage across a single photon avalanche diode, the method comprising:
   providing an output based on a current flowing through the single photon avalanche diode; and
   controlling the voltage applied across the single photon avalanche diode based on the provided output, wherein controlling the voltage applied across the single photon avalanche diode comprises:
   applying an initial voltage across the single photon avalanche diode,
   after applying the initial voltage, adjusting the voltage across the single photon avalanche diode until the provided output satisfies a condition, and after the provided output satisfies the condition, adjusting the voltage applied across the single photon avalanche diode by a set voltage value in response to the provided output satisfying the condition, wherein the initial voltage is greater than a voltage used in normal operation of the single photon avalanche diode, and wherein adjusting the voltage across the single photon avalanche diode comprises reducing the voltage across the single photon avalanche diode in response to the provided output.

2. The method of claim 1, wherein the provided output comprises a current.

3. The method as claimed in claim 1, comprising adjusting the initial voltage such that the voltage is closer to a voltage used in normal operation of the single photon avalanche diode.

4. The method of claim 1, wherein controlling the voltage applied across the single photon avalanche diode comprises adjusting a voltage at a cathode of the single photon avalanche diode.

5. The method of claim 1, wherein controlling the voltage applied across the single photon avalanche diode comprises adjusting a voltage at an anode of the single photon avalanche diode.

6. The method of claim 1, wherein providing the output comprises providing the output using a current mirror.

7. The method of claim 6, wherein the current mirror comprises metal-oxide semiconductor (MOS) transistors.

8. The method of claim 1, wherein controlling the voltage applied across the single photon avalanche diode comprises using an operational amplifier having an output coupled to control terminals of first and second transistors of a current mirror that is coupled to the single photon avalanche diode, and having a first input coupled to an anode of the single photon avalanche diode.

9. An apparatus for controlling a voltage applied across a single photon avalanche diode, the apparatus comprising:
a measurement circuit configured to provide an output based on a current flowing through the single photon avalanche diode, wherein the measurement circuit comprises a current mirror that comprises a first transistor and a second transistor;
a voltage setting circuit configured to control the voltage applied across the single photon avalanche diode based on the provided output, wherein the voltage setting circuit comprises an operational amplifier having an output coupled to control terminals of the first and second transistors, a first input coupled to the single photon avalanche diode, and a second input configured to receive a reference voltage; and
a current comparator configured to compare the provided output to a threshold current, wherein the current mirror is coupled between an input of the current comparator and the single photon avalanche diode.

10. The apparatus of claim 9, wherein the provided output comprises a current.

11. The apparatus of claim 9, wherein the voltage setting circuit is configured to adjust a current voltage applied across the single photon avalanche diode by a set voltage when the provided output satisfies a condition.

12. The apparatus of claim 9, wherein the voltage setting circuit is configured to control the voltage applied across the single photon avalanche diode in response to the comparison of the output to the threshold.

13. The apparatus of claim 9, wherein the voltage setting circuit is configured to:

control the voltage across the single photon avalanche diode such that the voltage is one of greater and smaller than a voltage user in normal operation of the single photon avalanche diode; and
adjust the voltage across the single photon avalanche diode in response to the provided output.

14. The apparatus of claim 9, wherein the voltage setting circuit is configured to control a cathode voltage of the single photon avalanche diode based on the provided output.

15. The apparatus of claim 9, wherein the voltage setting circuit is configured to control the voltage applied across the single photon avalanche diode by:
applying an initial voltage across the single photon avalanche diode,
after applying the initial voltage, adjusting the voltage across the single photon avalanche diode until the provided output satisfies a condition, and
after the provided output satisfies the condition, adjusting the voltage applied across the single photon avalanche diode by a set voltage value in response to the provided output satisfying the condition.

16. The apparatus of claim 15, wherein the first and second transistors are transistors of the n-type.

17. The apparatus of claim 15, wherein the initial voltage is smaller than a voltage used in normal operation of the single photon avalanche diode, and wherein adjusting the voltage across the single photon avalanche diode comprises increasing the voltage across the single photon avalanche diode in response to the provided output.

18. A device comprising:
a plurality of single photon avalanche diodes;
a measurement circuit configured to provide an output based on a current flowing through a first single photon avalanche diode of the plurality of single photon avalanche diodes; and
a voltage setting circuit configured to control a voltage applied across the first single photon avalanche diode based on the provided output, wherein controlling the voltage applied across the first single photon avalanche diode comprises:
applying an initial voltage across the first single photon avalanche diode,
after applying the initial voltage, adjusting the voltage across the first single photon avalanche diode until the provided output satisfies a condition, and
after the provided output satisfies the condition, adjusting the voltage applied across the first single photon avalanche diode by a set voltage value in response to the provided output satisfying the condition, wherein the measurement circuit comprises a current mirror that comprises first and second transistors, the first transistor having a current path coupled to the first single photon avalanche diode, and wherein the voltage setting circuit comprises an operational amplifier having an output coupled to control terminals of the first and second transistors.

19. The device of claim 18, wherein the voltage setting circuit is configured to control a voltage applied across a second single photon avalanche diode of the plurality of single photon avalanche diodes based on the provided output.

20. The device of claim 18, wherein the operational amplifier comprises a first input coupled to the first single photon avalanche diode.

21. The device of claim 20, wherein the first input of the operational amplifier is a positive input.

22. The device of claim 18, wherein the initial voltage is smaller than a voltage used in normal operation of the first single photon avalanche diode, and wherein adjusting the voltage across the first single photon avalanche diode comprises increasing the voltage across the first single photon avalanche diode in response to the provided output.

23. The device of claim 18, wherein the initial voltage is greater than a voltage used in normal operation of the first single photon avalanche diode, and wherein adjusting the voltage across the first single photon avalanche diode comprises reducing the voltage across the first single photon avalanche diode in response to the provided output.

\* \* \* \* \*